(12) United States Patent
Tsunomura et al.

(10) Patent No.: US 8,178,776 B2
(45) Date of Patent: May 15, 2012

(54) PHOTOVOLTAIC MODULE AND METHOD FOR MANUFACTURING PHOTOVOLTAIC MODULE

(75) Inventors: Yasufumi Tsunomura, Kobe (JP); Yukihiro Yoshimine, Kobe (JP); Haruhisa Hashimoto, Mino (JP); Eiji Maruyama, Katano (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 737 days.

(21) Appl. No.: 11/723,849

(22) Filed: Mar. 22, 2007

(65) Prior Publication Data
US 2007/0227584 A1  Oct. 4, 2007

(30) Foreign Application Priority Data

Mar. 30, 2006 (JP) .................... P2006-095647
Feb. 8, 2007 (JP) .................... P2007-029661

(51) Int. Cl.
*H01L 31/0203* (2006.01)

(52) U.S. Cl. ................ 136/251; 136/259; 438/64

(58) Field of Classification Search .......... 136/243–251
See application file for complete search history.

(56) References Cited

U.S. PATENT DOCUMENTS

| 5,684,325 | A |   | 11/1997 | Kataoka et al. |
| 5,800,631 | A | * | 9/1998 | Yamada et al. ............... 136/251 |
| 6,204,443 | B1 | * | 3/2001 | Kiso et al. ..................... 136/259 |
| 6,307,145 | B1 | * | 10/2001 | Kataoka et al. ............... 136/251 |
| 6,323,416 | B1 | * | 11/2001 | Komori et al. ................ 136/259 |
| 6,762,508 | B1 | * | 7/2004 | Kiso et al. ..................... 257/787 |
| 2002/0148496 | A1 |   | 10/2002 | Dorner et al. |
| 2003/0075210 | A1 |   | 4/2003 | Stollwerck et al. |

FOREIGN PATENT DOCUMENTS

| JP | 10-341030 A | 12/1998 |
| JP | 11-61055 A | 3/1999 |

OTHER PUBLICATIONS

Extended European Search Report from corresponding case, dated Nov. 3, 2009.

\* cited by examiner

*Primary Examiner* — Jeffrey T Barton
*Assistant Examiner* — Jayne Mershon
(74) *Attorney, Agent, or Firm* — NDQ&M Watchstone LLP

(57) ABSTRACT

An object of the present invention is to provide a photovoltaic module that achieves a reduction in adverse influence of damage accumulated in a collector electrode provided on the light receiving surface side, and a method for manufacturing the photovoltaic module. To this end, in a photovoltaic module of the present invention, the degree of cross-linkage of the second region of the sealing material that is in contact with the back surface of the solar cell is smaller than that of the first region of the sealing material that is in contact with the light receiving surface of the solar cell.

4 Claims, 7 Drawing Sheets

(SOLAR LIGHT INCIDENT)

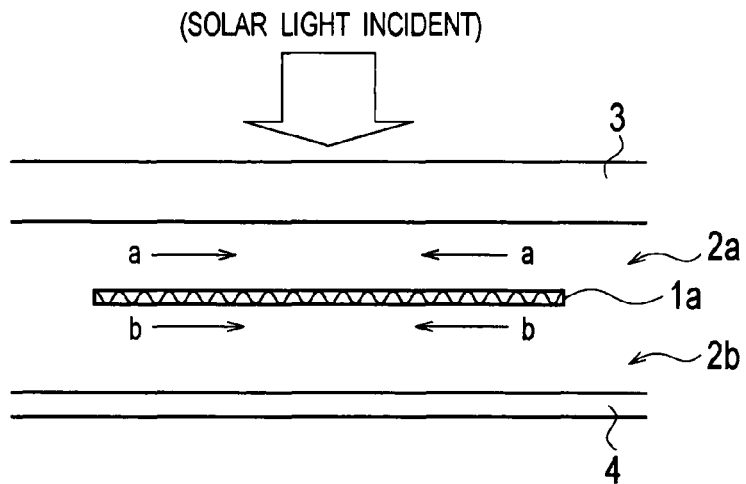
FIG. 9A
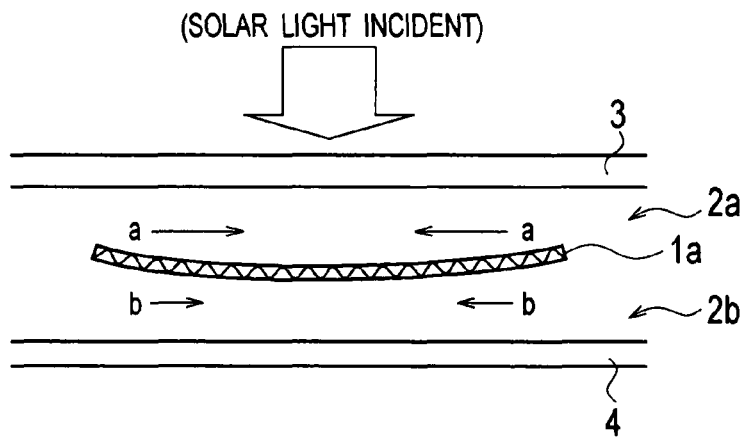
FIG. 9B
FIG. 10
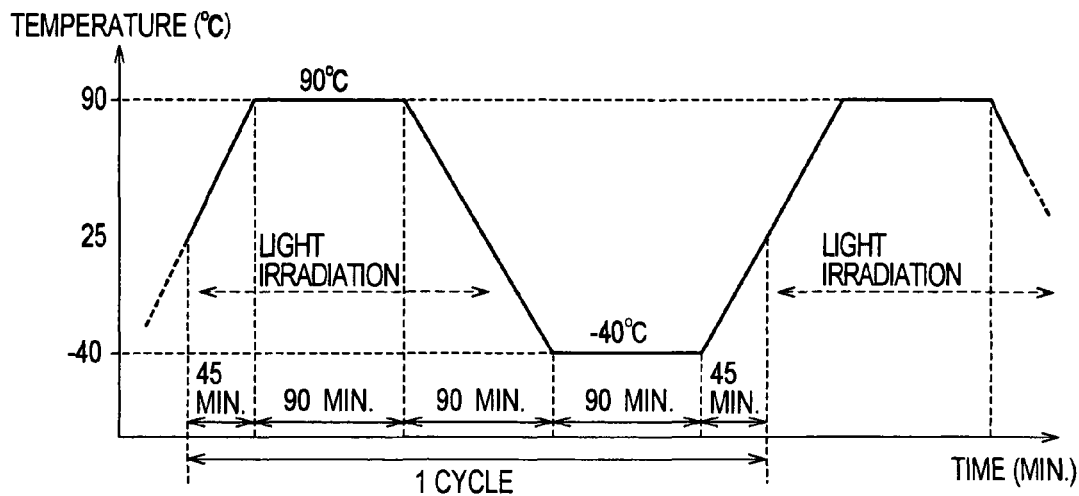

PHOTOVOLTAIC MODULE AND METHOD FOR MANUFACTURING PHOTOVOLTAIC MODULE

CROSS REFERENCE TO RELATED APPLICATIONS

This application is based upon and claims the benefit of priority from prior Japanese Patent Application No. 2006-095647, filed on Mar. 30, 2006; and prior Japanese Patent Application No. 2007-029661, filed on Feb. 8, 2007; the entire contents of which are incorporated herein by reference.

BACKGROUND OF THE INVENTION

1. Technical Field of the Invention

The present invention relates to a photovoltaic module and a method for manufacturing the photovoltaic module. In particular, the present invention relates to a photovoltaic module that brings improved reliability, and a method for manufacturing the photovoltaic module.

2. Description of the Related Art

A photovoltaic system directly converts the solar light, which is clean and inexhaustibly supplied, into electricity. For this reason, the photovoltaic system is expected as a new energy source.

Here, in a case of a solar cell constituting the photovoltaic system, an output power per unit is in the order of several watts. For this reason, when a photovoltaic system is used as an electric power source for a house, a building or the like, a photovoltaic module including a plurality of solar cells that are electrically connected to one another in series or in parallel is used. With this module, the output power of the photovoltaic system can be increased up to the order of several hundred watts.

To be more precise, as shown in FIG. 1, a photovoltaic module 100 includes a solar cell 101, a light receiving surface side supporting member 102, a back surface side supporting member 103 and a sealing material 104. The light receiving surface side supporting member 102 is provided along a light receiving surface of the solar cell 101. The back surface side supporting member 103 is provided along a back surface of the solar cell 101. The sealing material 104 seals the solar cell 101 between the light receiving surface side supporting member 102 and the back surface side supporting member 103.

In order to accelerate curing of the sealing material 104 in the photovoltaic module 100, proposed is a technique of adding cross-linking agent to the sealing material 104 (For example, Japanese Patent Application Laid-open Publication No. Hei 11-61055).

When the photovoltaic module 100 does not receive the solar light, a stress a on the light receiving surface side of the solar cell 101 is substantially equal to a stress b on the back surface side of the solar cell 101, as shown in FIG. 1.

In contrast, when the photovoltaic module 100 receives the solar light, the temperature on the light receiving surface side of the solar cell 101 becomes higher than the temperature on the back surface side of the solar cell 101. With this phenomenon, the sealing material 104 is thermally expanded more on the light receiving surface side of the solar cell 101 than on the back surface side of the solar cell 101. Since a coefficient of thermal expansion of the sealing material 104 is greater than that of the solar cell 101, the stress a on the light receiving surface side of the solar cell 101 becomes smaller than the stress b on the back surface side thereof, as shown in FIG. 2.

In this way, when the solar cell 101 receives the solar light, the balance between the stress a and the stress b is disrupted. As a result, the solar cell 101 is warped as shown in FIG. 2.

Here, as shown in FIG. 3, in order to collect photogenerated carriers generated in a photovoltaic body 105, the solar cell 101 is provided with a collector electrode 106 on the light receiving surface of the photovoltaic body 105, and a collector electrode 107 on the back surface of the photovoltaic body 105. Since the collector electrode 106 is provided on the light receiving surface side of the photovoltaic body 105, it is preferable to form the collector electrode 106 as narrow as possible in order not to block the reception of the solar light.

However, when the solar cell 101 is warped due to the reception of the solar light, a stress is applied to the collector electrode 106. In addition, since the photovoltaic module 100 is used in the open air, and repeats receiving and not receiving the solar light, damage in the collector electrode 106 is accumulated. For this reason, the electron collection performance of the collector electrode 106 is likely to be lowered. Moreover, the thinner the thickness of a substrate constituting the photovoltaic body 105 is, the more heavily the solar cell 101 is warped. Accordingly, heretofore, the thickness of the substrate cannot be made extremely thin.

THE SUMMARY OF THE INVENTION

The present invention has been made in consideration of the aforementioned problem. An object of the present invention is to provide a photovoltaic module that achieves a reduction in adverse influence of damage accumulated in a collector electrode provided on a light receiving surface side, and a method for manufacturing the photovoltaic module.

In summary, a photovoltaic module according to a first aspect of the present invention includes a solar cell, a light receiving surface side supporting member, a back surface side supporting member and a sealing material, and also has the following features. The solar cell has a light receiving surface allowing light to enter therein, and a back surface provided on the opposite side of the light receiving surface. The light receiving surface side supporting member is provided at the light receiving surface side of the solar cell. The back surface side supporting member is provided at the back surface side of the solar cell. The sealing material seals the solar cell between the light receiving surface side supporting member and the back surface side supporting member. The sealing material includes a first region that is in contact with the light receiving surface, and a second region that is in contact with the back surface. A degree of cross-linkage of the second region is smaller than that of the first region.

In this photovoltaic module, by making the degree of cross-linkage of the second region smaller than that of the first region, the second region of the sealing material that is in contact with the back surface of the solar cell is thermally expanded easily at a lower temperature than the first region of the sealing material that is in contact with the light receiving surface of the solar cell. Accordingly, when the photovoltaic module is subjected to the solar light during daytime, the second region whose temperature is less likely to rise can also be thermally expanded. This makes it possible to reduce the stress applied to the solar cell on the back surface side as well, and thereby to reduce the difference between the stresses of the light receiving surface side and the back surface side of the solar cell. This results in a relaxation of a force that acts to warp the solar cell so as to be convex toward the light receiving side. Hence, the stress applied to a collector electrode adhering to the light receiving surface is lowered.

A second aspect of the present invention is summarized in that a gel fraction of the second region is smaller than that of the first region in the photovoltaic module according to the first aspect of the present invention.

A third aspect of the present invention is related to the first or second aspect of the present invention, and is summarized in that a amount of a cross-liking agent used for forming crosslinks in the second region is smaller than that used for forming crosslinks in the first region.

A fourth aspect of the present invention is related to the first aspect of the present invention, and is summarized in that the solar cell has a photovoltaic body for generating photogenerated carriers by receiving light, and a collector electrode which adheres onto the light receiving surface and the back surface of the photovoltaic body, and which collects the photogenerated carriers from the photovoltaic body. In addition, in the solar cell, an adhesion area where the collector electrode adheres onto the light receiving surface of the photovoltaic body is smaller than that where the collector electrode adheres onto the back surface of the photovoltaic body.

In summary, a photovoltaic module according to a fifth aspect of the present invention includes a solar cell, a light receiving surface side supporting member, a back surface side supporting member and a sealing material, and also has the following features. The solar cell has a light receiving surface allowing light to enter therein, and a back surface provided on the opposite side of the light receiving surface. The light receiving surface side supporting member is provided at the light receiving surface side of the solar cell. The back surface side supporting member is provided at the back surface side of the solar cell. The sealing material seals the solar cell between the light receiving surface side supporting member and the back surface side supporting member. The sealing material includes a first region that is in contact with the light receiving surface, and a second region that is in contact with the back surface. The gel fraction of the second region is smaller than that of the first region.

In summary, a sixth aspect of the present invention is a method for manufacturing a photovoltaic module including: a solar cell having a light receiving surface allowing light to enter therein, and a back surface provided on the opposite side of the light receiving surface; a light receiving surface side supporting member provided at the light receiving surface side of the solar cell; a back surface side supporting member provided at the back surface side of the solar cell; and a sealing material for sealing the solar cell between the light receiving surface side supporting member and the back surface side supporting member. The method includes steps A and B. In step A, a layered product is obtained by laminating the light receiving surface side supporting member, a first sealing material sheet constituting the sealing material, the solar cell, a second sealing material sheet constituting the sealing material, and the back surface side supporting member on one another in this order. In step B, a crosslinking reaction in the sealing material is promoted by heating the layered product. In addition, in step B, a condition for heating the second sealing material sheet is less favorable for the crosslinking reaction in the sealing material than a condition for heating the first sealing material sheet.

According to the present invention, it is possible to provide a photovoltaic module that achieves a reduction in adverse influence of damage accumulated in a collector electrode provided on a light receiving surface side, and a method for manufacturing the photovoltaic module.

BRIEF DESCRIPTION OF THE DRAWINGS

FIG. 9A is a diagram for explaining stresses applied to a solar cell according to the embodiment.

FIG. 9B is a diagram for explaining stresses applied to a solar cell according to the embodiment.

FIG. 10 is a graph of a temperature condition in a temperature cycle test.

DETAILED DESCRIPTION OF THE PREFERRED EMBODIMENTS

Figure 1:
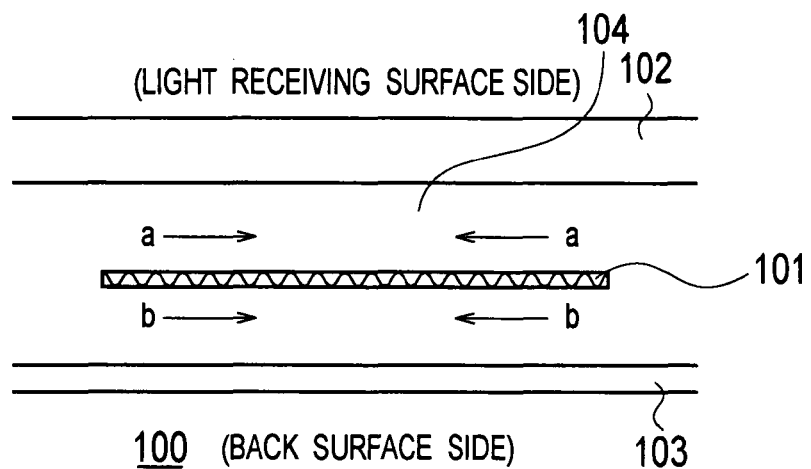
FIG. 1 is a diagram for explaining stresses applied to a conventional solar cell.

Hereinafter, a embodiment of the present invention will be described by using the drawings. In the following description of the drawings, the same or similar reference numerals are given to the same or similar components. It should be noted that the drawings are schematic ones, each dimensional ratio or the like shown in the drawings are different from those of actual ones. For this reason, specific dimensions or the like should be determined with reference to the following description. Moreover, as a matter of course, the drawings include part where there are differences among the drawings in terms of dimensional relationships and ratios.

<Photovoltaic Module 10>

Figure 4A:
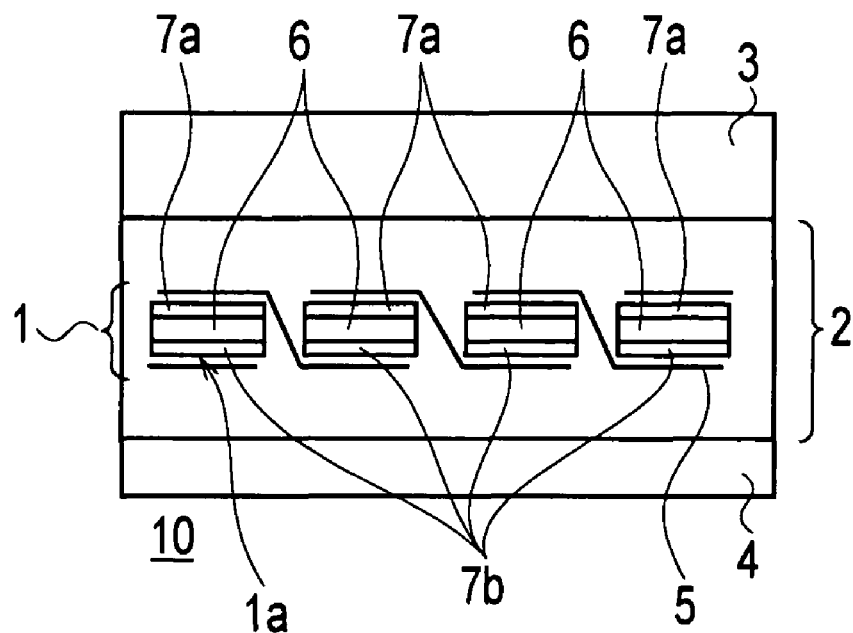
FIG. 4A is a diagram for explaining a photovoltaic module according to an embodiment.
Figure 4B:
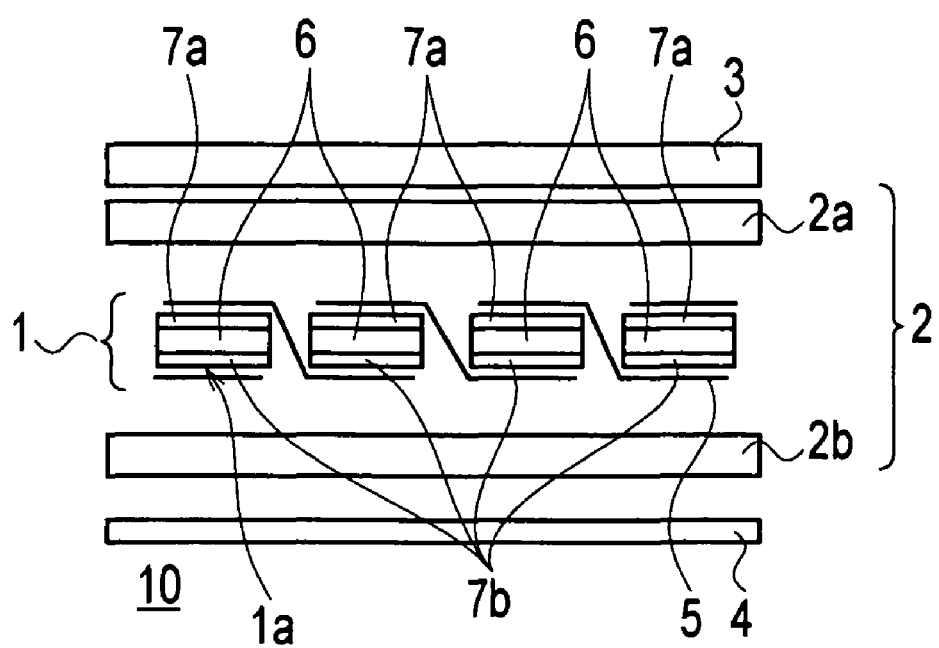
FIG. 4B is a diagram for explaining a photovoltaic module according to an embodiment.

FIGS. 4A and 4B show cross sectional diagrams of a photovoltaic module 10 according to this embodiment. FIG. 4A is a diagram for illustrating a cross sectional structure of the photovoltaic module 10 that has been integrated through a module forming process. FIG. 4B is an exploded diagram for illustrating the photovoltaic module 10 before the module forming process.

The photovoltaic module 10 includes a solar cell string 1, a sealing material 2, a light receiving surface side supporting member 3 and a back surface side supporting member 4.

The solar cell string 1 is formed of a plurality of solar cells 1a which are electrically connected to one another with wiring materials 5.

The solar cell 1a includes a photovoltaic body 6 and a collector electrode 7.

The photovoltaic body 6 can be formed of a general solar cell material which includes a semiconductor junction such as a pn junction or a pin junction therein, including: a crystal type semiconductor material such as single-crystalline silicon (Si) and poly-crystalline Si; a compound type semiconductor material such as GaAs and CuInSe; a thin-film silicon type material; a organic type material such as dye sensitization type material; or the like.

The collector electrode 7 adheres onto the light receiving surface and the back surface of the photovoltaic body 6, and collects photogenerated carriers generated in the photovoltaic body 6. For this purpose, the collector electrode 7 includes a light receiving surface side electrode 7a and a back surface side electrode 7b.

The light receiving surface side electrode 7a and the back surface side electrode 7b are formed of a conductive material including silver, aluminum, copper, nickel, tin, gold or the like, or alloy of any of these. Note that the collector electrode 7 may have a monolayer structure or a multilayer structure including the conductive material. In addition to the foregoing layer including the conductive material, the electrode may have a layer including a translucent conductive oxide such as $SnO_2$, ITO, IWO or ZnO.

Figure 5:
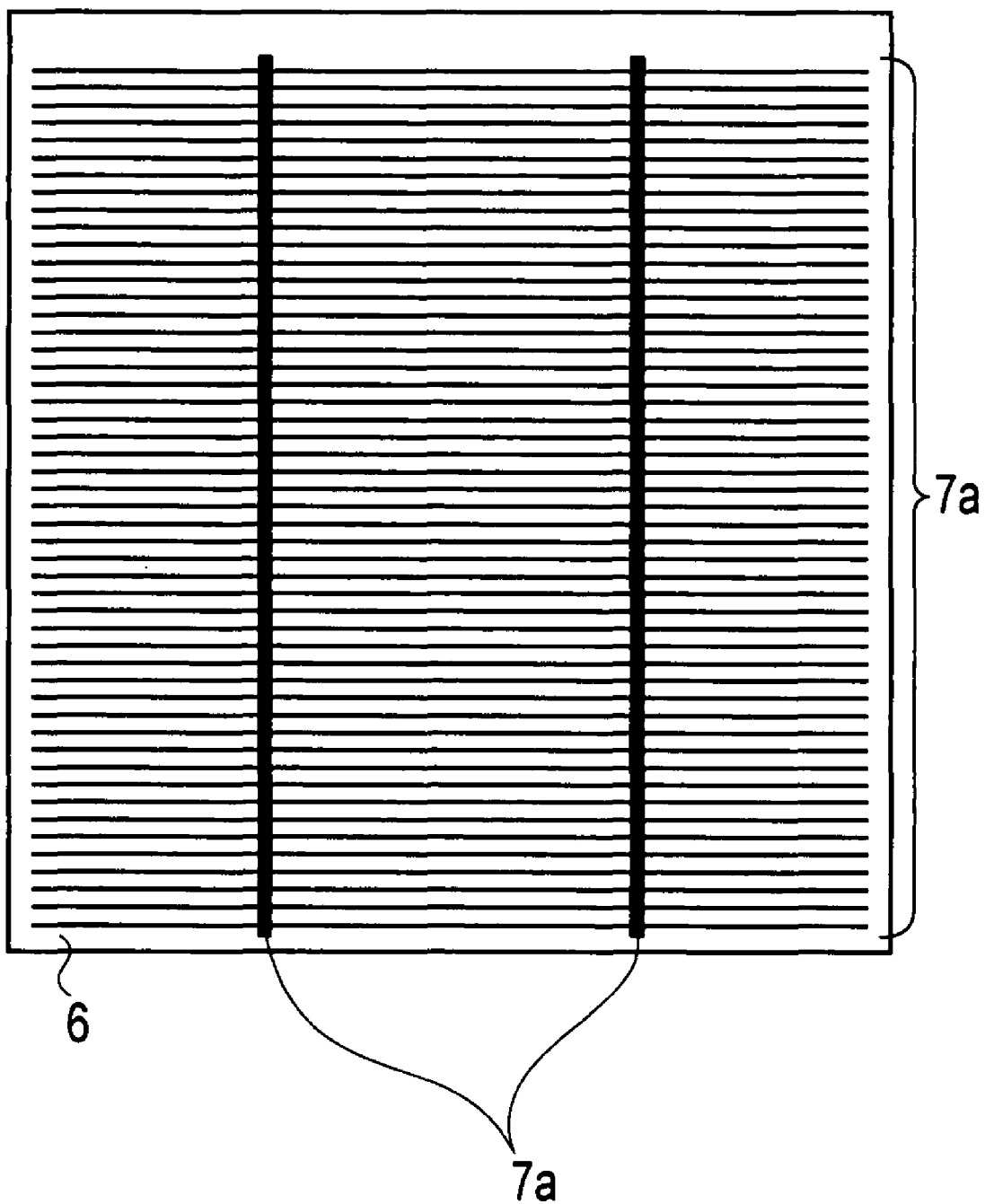
FIG. 5 is a diagram for explaining a solar cell according to the embodiment.

The light receiving surface side electrode 7a is provided so as to occupy an area as small as possible for the purpose of securing a large light receiving area on the light receiving surface side of the photovoltaic body 6, that is, for securing the large exposed area on the light receiving surface side of the photovoltaic body 6. For example, the light receiving surface side electrode 7a is formed in a comb-like shape with the width of the light receiving surface side electrode 7a made narrow, as shown in a top view of the solar cell 1a (see FIG. 5). On the other hand, the back surface side electrode 7b may be formed in a comb-like shape, or may be formed over an entire area of the back surface of the photovoltaic body 6. In this embodiment, as described above, the adhesion area where the light receiving surface side electrode 7a adheres onto the light receiving surface of the photovoltaic body 6 is smaller than the adhesion area where the back surface side electrode 7b adheres onto the back surface of the photovoltaic body 6.

The sealing material 2 seals the solar cell string 1. Specifically, as shown in FIG. 4B, the light receiving surface of the solar cell 1a is in contact with a first region 2a of the sealing material 2, and the back surface of the solar cell 1a is in contact with a second region 2b of the sealing material 2.

The sealing material 2 can be formed of a resin material such as EVA (ethylene vinyl acetate), PVB (polyvinyl butyral), silicone resin, urethane resin, acrylic resin, fluorocarbon-based resin, ionomer resin, silane denatured resin, ethylene-acrylic acid copolymer, ethylene-methacrylic acid copolymer, polyethylene-based resin, polypropylene-based resin, acid-denatured polyolefin based resin, or epoxy-based resin. More than one type of the above resin materials may be used and compounded to form the sealing material 2.

Here, in this embodiment, the degree of cross-linkage in the second region 2b of the sealing material 2 that is in contact with the back surface of the solar cell 1a is smaller than that of the first region 2a of the sealing material 2 that is in contact with the light receiving surface of the solar cell 1a. Such a structure of the sealing material 2 will be described later in detail, since it relates to a feature of the present invention. Incidentally, the degree of cross-linkage means a crosslinking rate in the sealing material 2, and a smaller degree of cross-linkage means that a larger region containing non-crosslinked resin component exists.

The light receiving surface side supporting member 3 is joined to the light receiving side of the solar cell 1a on contact with the first region 2a of the sealing material 2 interposed in between. The light receiving surface side supporting member 3 may be formed of a material, such as glass or plastic, allowing greater part of light with a wavelength which the solar cell 1a can absorb to pass therethrough.

The back surface side supporting member 4 is joined to the back surface of the solar cell 1a on contact with the second region 2b of the sealing material 2 interposed in between. The back surface side supporting member 4 can be formed of a material such as a resin film including a PET (polyethylene terephthalate) film, a fluorine resin film, or the like; a resin film in which a vapor-deposited film of metal oxide such as silica or alumina is formed; a metal film such as an aluminum foil; or a lamination film including some of these films.

As described above, in this embodiment, the light receiving surface of the solar cell 1a is in contact with the first region 2a of the sealing material 2, and the back surface of the solar cell 1a is in contact with the second region 2b of the sealing material 2.

<About Degree of Cross-Linkage of Sealing Material 2>

This embodiment is characterized in that the degree of cross-linkage of the second region 2b of the sealing material 2 which is in contact with the back surface of the solar cell 1a is smaller than that of the first region 2a of the sealing material 2 which is in contact with the light receiving surface of the solar cell 1a. Any of the following methods can be used to make the degree of cross-linkage of the second region 2b smaller than that of the first region 2a like the above.

In a first method, the same sealing material to which a cross-linking agent of the same type and the same amount is added is used as a sealing material to form the first region 2a and the second region 2b. Then, different crosslinking conditions are employed to form the respective regions 2a and 2b. In this way, the degree of cross-linkage of the second region 2b can be made smaller than that of the first region 2a. Specifically, a temperature that causes crosslinks to be formed in the sealing material used for forming the second region 2b is set lower than a temperature that causes crosslinks to be formed in the sealing material used for forming the second region 2a. Thereby, the degree of cross-linkage of the second region 2b can be made smaller than that of the first region 2a.

In a second method, the degree of cross-linkage of the second region 2b can be made smaller than that of the first region 2a by using the smaller amount of cross-linking agent added to the sealing material for forming the second region 2b, than that of cross-linking agent added to the sealing material for forming the second region 2a. In this case, the degree of cross-linkage of the sealing material mainly depends on the amount of cross-linking agent added to the sealing material, and depends on the type of the sealing material only to a slight degree. For this reason, any one of or a combination of the foregoing resin materials such as the EVA and the PVB can be used as the sealing material for forming the first region 2a and the second region 2b.

Note that an organic peroxide is used as a cross-linking agent, in general. For example, as the organic peroxide for causing crosslinks to be formed in the EVA, it is possible to use 2,5-dimethylhexane, 2,5-dihydroperoxide, 2,5-dimethyl-2,5-di(t-butylperoxy)hexane, 3-di-t-butylperoxide, t-dicumylperoxide, 2,5-dimethyl-2,5-di(t-butylperoxy)hexane, dicumylperoxide, α,α'-bis(t-butylperoxyisopropyl)benzene, n-butyl-4,4-bis(t-butylperoxy)butane, 2,2-bis(t-butylperoxy)butane, 1,1-bis(t-butylperoxy)cyclohexane, 1,1-bis(t-butylperoxy) 3,3,5-trimethylcyclohexane, t-butylperoxybenzoate, benzoylperoxide or the like.

<About Structure of the Sealing Material 2>

The present invention is characterized in that the above-described relationship is satisfied between the degrees of cross-linkage of the first region 2a and the second region 2b of the sealing material 2 which are in contact with the light receiving surface and the back surface of the solar cell 1a, respectively. Accordingly, the sealing material 2 may further include another sealing material as long as it includes the first region 2a and the second region 2b that satisfy the above-described relationship.

For example, the sealing material 2 may include the first region 2a that is in contact with the light receiving surface of the solar cell 1a, and may further include one or more sealing material layers on the light receiving surface side of the first region 2a. Similarly, the sealing material 2 may include the second region 2b that is in contact with the back surface of the solar cell 1a, and may further include one or more sealing material layers on the back surface side of the second region 2b. Alternatively, the sealing material 2 may have a structure formed by combining these two.

Figure 6:
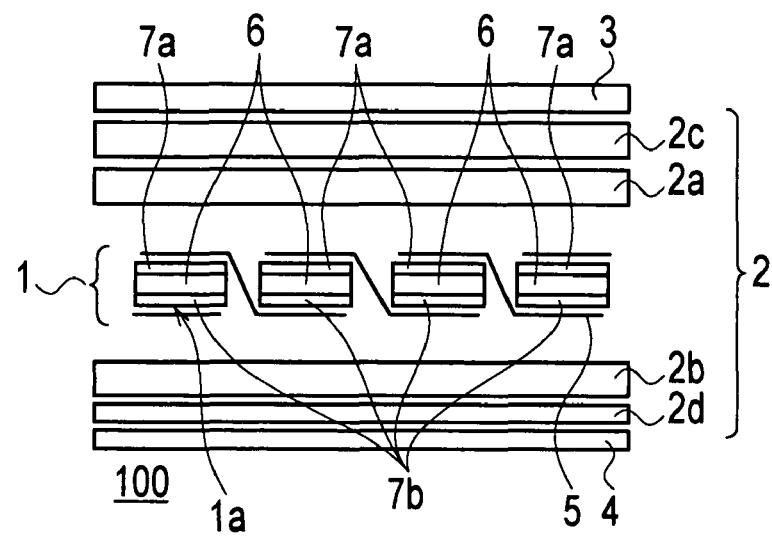
FIG. 6 is a diagram for explaining the photovoltaic module according to the embodiment.

FIG. 6 is an exploded cross sectional diagram of the photovoltaic module 10 including a third region 2c on the light receiving surface of the first region 2a, and also a fourth region 2d on the back surface of the second region 2b. In the photovoltaic module 10 shown in FIG. 6, the degree of cross-linkage of the second region 2b of the sealing material 2 that is in contact with the back surface of the solar cell 1a is smaller than that of the first region 2a of the sealing material 2 that is in contact with the light receiving surface of the solar cell 1a. In addition, as sealing materials for forming the third region and the fourth region, it is possible to select any one of or a combination of the foregoing materials such as the EVA and the PVB.

In this way, the sealing material 2 may have a multi-layered structure including three layers or more.

<Method for Manufacturing Photovoltaic Module 10>

Figure 7:
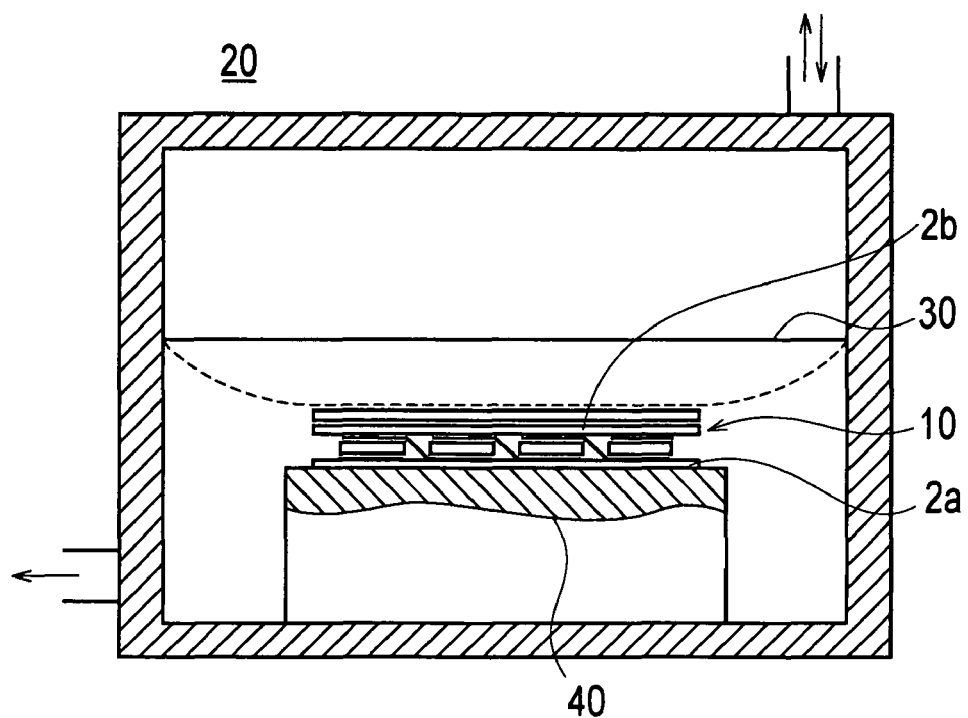
FIG. 7 is a diagram for explaining a vacuum lamination apparatus used in a laminating process.
Figure 8A:
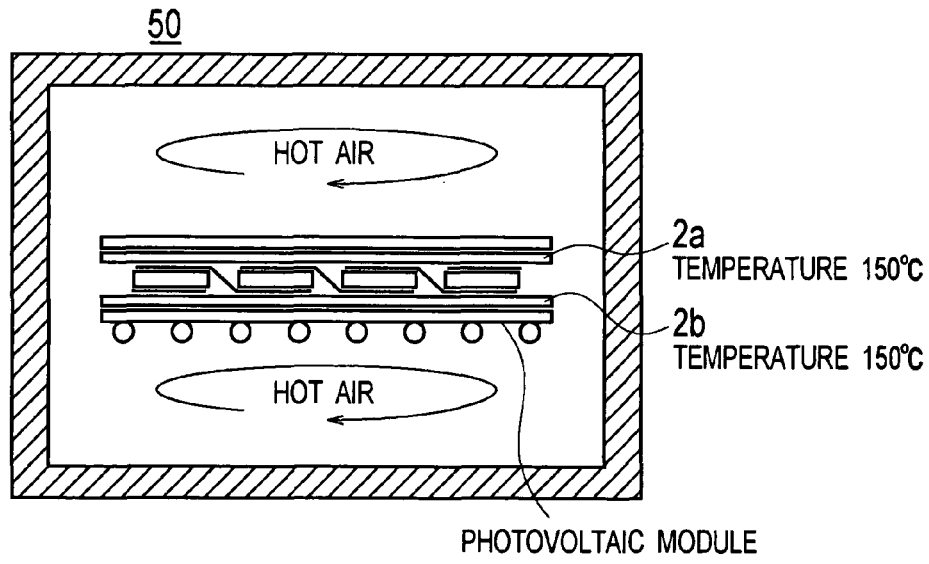
FIG. 8A is a diagram for explaining a heater used in a curing process.
Figure 8B:
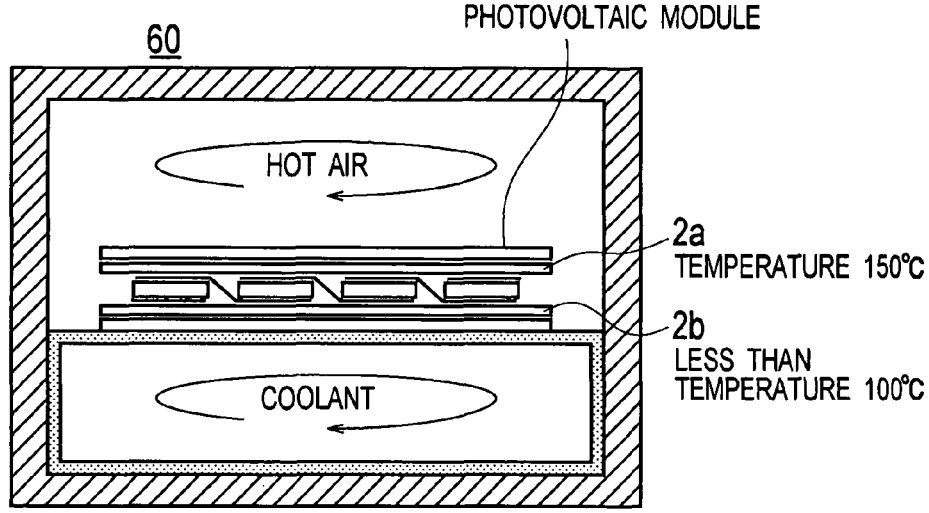
FIG. 8B is a diagram for explaining a heater used in a curing process.
Figure 8C:
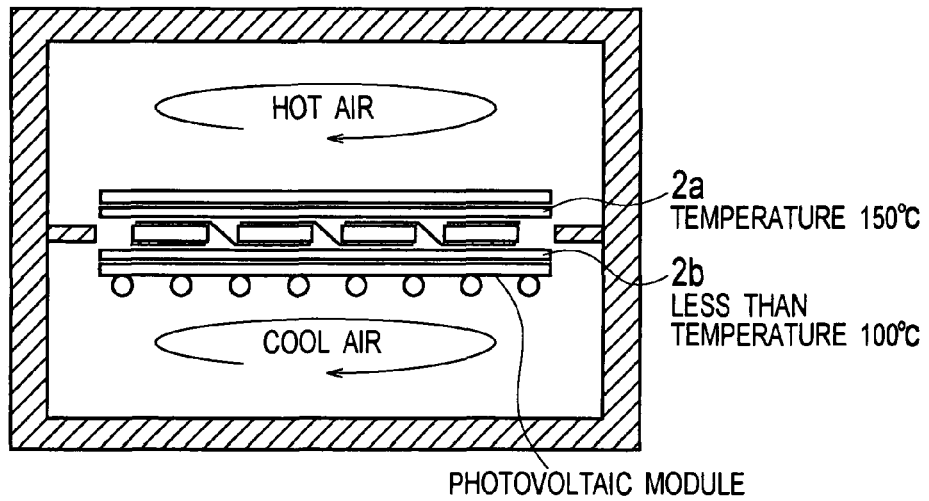
FIG. 8C is a diagram for explaining a heater used in a curing process.

By using FIGS. 7 and 8, descriptions will be given of a method for manufacturing the photovoltaic module 10 according to the present invention, that is, a module forming process for the photovoltaic module 10. The descriptions will be given of a case where the same sealing material is used for the first region 2a and the second region 2b firstly, and then a case where the amount of cross-linking agent added to a sealing material for the second region 2b is made smaller than that for the first region 2a.

(1) Case Where the Same Sealing Material is Used for the First Region 2a and the Second Region 2b In this case, by changing a condition of a heating temperature and a heating duration, the degree of cross-linkage of the second region 2b of the sealing material 2 that is in contact with the back surface of the solar cell 1a is made smaller than that of the first region 2a of the sealing material 2 that is in contact with the light receiving surface of the solar cell 1a. The following three processes are used for changing the condition.

Laminating process: In this process, internal materials are made to temporarily adhere to each other by using a vacuum lamination apparatus 20 shown in FIG. 7 while an air bubble is prevented from forming between each pair of the internal materials. The interior of the vacuum lamination apparatus 20 is divided into two chambers, that is, upper and lower chambers with a diaphragm 30, and thereby it is possible to decompress each of the chambers independently. Firstly, the light receiving surface side supporting member 3, the light receiving side sealing material sheet (first region) 2a, the solar cell string 1, the back surface side sealing material sheet (second region) 2b and the back surface side supporting member 4 are mounted in this order on a mounting table 40 which can be heated. Secondly, the air is discharged from each of the upper and lower chambers, while the mounting table 40 is being heated up to a predetermined temperature. In this way, the formation of an air bubble is prevented. Here, the predetermined temperature is lower than a temperature causing crosslinks to be formed in the sealing material 2. Then, the photovoltaic module 10 is pressed with the diaphragm 30 for a predetermined duration by causing the air to flow into the upper chamber. Hence, the temporary adhesion is completed.

First curing process: In this process, the sealing material 2 is cured crosslinks are formed in the sealing material 2 by using a heater 50 shown in FIG. 8A. The heater 50 is capable of uniformly heating the photovoltaic module 10 by high-temperature blast thereto. Firstly, the photovoltaic module 10 including the temporarily adhering internal materials is placed inside the heater 50. Then, the photovoltaic module 10 is heated at a predetermined temperature for a predetermined duration. Here, the predetermined temperature is set to be higher than the temperature causing crosslinks to be formed in the sealing material 2. By using such a temperature, crosslinking reaction occurs in the first region 2a of the sealing material 2 that is in contact with the light receiving surface of the solar cell 1a, and in the second region 2b of the sealing material 2 that is in contact with the back surface of the solar cell 1a.

Second curing process: In this process, the crosslinking reaction is more advanced in the first region 2a of the sealing material 2 that is in contact with the light receiving surface of the solar cell 1a, by using a heater 60 shown in FIG. 8B or 8C. The heater 60 shown in FIG. 8B or 8C heats the light receiving surface side by using the hot air, while cooling the back surface side by using a cooling medium or a cool air. Alternatively, the heater 60 heats only the sealing material on the light receiving surface side at the temperature higher than the crosslinking temperature, while heating the sealing material on the back surface side at the temperature lower than the crosslinking temperature. In this manner, the crosslinking reaction is advanced only in the first region 2a of the sealing material 2 that is in contact with the light receiving surface of the solar cell 1a.

While being processed through the foregoing processes, the crosslinks are formed in the sealing material on the light receiving surface side during the first curing process and the second curing process. On the other hand, the crosslinks are formed in the sealing material on the back surface side during only the first curing process.

(2) Case where the Amount of Cross-Linking Agent Added to the Sealing Material for the Second Region 2b is Made Smaller than that Added to the Sealing Material for the First Region 2a.

In this case, it is not necessary to separately adjust the heating durations in the curing processes for the first region 2a and the second region 2b, unlike the case where the same sealing material is used for the first region 2a and the second region 2b. This is because the degree of cross-linkage depends on the amount of cross-linking agent. Accordingly, it is not necessary to change the condition of the heating temperature and the heating duration between the light receiving surface side and the back surface side of the photovoltaic module 10. For this reason, only two processes of the laminating process and the first curing process are used.

After being processed in the foregoing laminating process, the photovoltaic module 10 is heated at the temperature higher than the crosslinking temperature of the sealing material 2 for a predetermined duration. Here, the predetermined duration is one during which the crosslink formation in the sealing material 2 is completed. There is no need to perform the second curing process.

In the foregoing manner, the photovoltaic module 10 of this embodiment is manufactured.

<Effect>

According to this embodiment, by applying such a structure to a photovoltaic module, it is possible to provide the photovoltaic module that brings improved reliability by preventing damage to a collector electrode from accumulating, the damage caused by a difference in the way that the light receiving and back surfaces of the photovoltaic module are subjected to the solar light. The reason for this will be described in detail below.

Table 1 is a property table showing the linear expansion coefficients of main materials constituting a photovoltaic module. As the sealing material, shown is the value of EVA resin, which is a typically used material. As the solar cell, shown is the value of silicon, which is a generally used material. In addition, as the back surface side supporting member, shown is the value of a PET film. As shown in Table 1, the linear expansion coefficients have a relationship of the sealing material>the PET film>copper>glass≈the silicon. Moreover, a difference between the linear expansion coefficients of the sealing material and the silicon is the largest among those between any pair of the components constituting the photovoltaic module.

TABLE 1

| LINER EXPANSION COEFFICIENTS OF MAIN MATERIALS FOR PHOTOVOLTAIC MODULE (UNIT: ° C. $^{-1}$) | |
|---|---|
| SEALING MATERIAL | ~4 × $10^{-4}$ (TYPICAL EXAMPLE) |
| PET | ~0.7 × $10^{-4}$ |
| COPPER | ~0.17 × $10^{-4}$ |
| GLASS | ~0.05 × $10^{-4}$ |
| SILICON | ~0.03 × $10^{-4}$ |

Accordingly, in terms of the contraction degrees of the components that have been thermally expanded in the module forming processing, the sealing material with the largest linear expansion coefficient has the largest contraction degree, and the solar cell formed of a silicon material with the smallest linear expansion coefficient has the smallest contraction degree.

Figure 2:
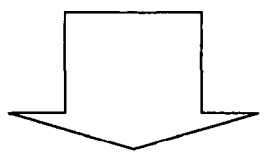
FIG. 2 is a diagram for explaining the stresses applied to the conventional solar cell.
Figure 2:
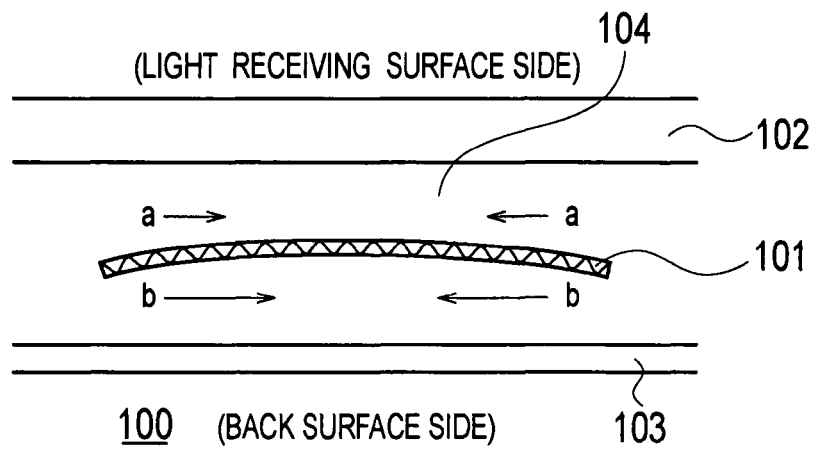
Figure 3:
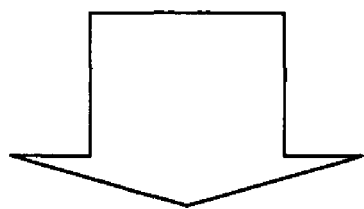
FIG. 3 is a diagram for explaining the stresses applied to the conventional solar cell.
Figure 3:
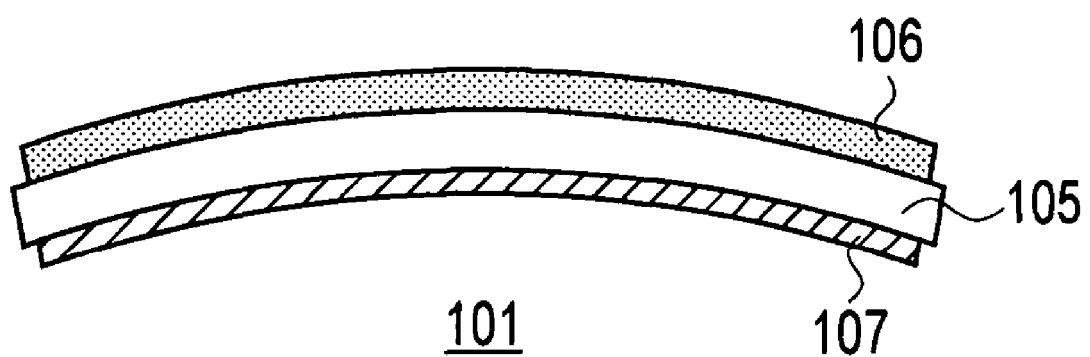

For this reason, when the conventional photovoltaic module 100 receives the solar light, the stress a applied to the light receiving surface of the solar cell 101, and the stress b applied to the back surface of the solar cell 101 are unbalanced, and thereby the solar cell 101 is warped, as shown in FIGS. 2 and 3. As a result, damage to the collector electrode 106 is accumulated therein, and this deteriorates the electron collection performance of the collector electrode 106.

Incidentally, the thinner the thickness of a silicon wafer becomes, the more frequently, the above-described deterioration of the power of the photovoltaic module happens.

In contrast to this, in a case of the photovoltaic module 10 according to this embodiment, the second region 2b of the sealing material 2 that is in contact with the back surface of the solar cell 1a is thermally expanded easily at a lower temperature than the first region 2a of the sealing material 2 that is in contact with the light receiving surface of the solar cell 1a, by making the degree of cross-linkage of the second region 2b smaller than that of the first region 2a. Accordingly, when the photovoltaic module 10 is subjected to the solar light during daytime, the second region 2b whose temperature is less likely to rise can also be thermally expanded. This makes it possible to reduce the stress applied to the solar cell 1a on the back surface side as well, and thereby to reduce the difference between the stresses on the light receiving surface side and the back surface side of the solar cell 1a. This results in a relaxation of a force that acts to warp the solar cell 1a so as to be convex toward the light receiving side. Hence, the stress applied to the light receiving surface side electrode 7a is lowered.

To be more precise, in a case where the solar light enters the photovoltaic module 10 of this embodiment as shown in FIGS. 9A and 9B, the stress applied to the light receiving surface of the solar cell 1a is equal in magnitude to the stress applied to the back surface (see FIG. 9A), or the stress applied to the back surface is greater than that applied to the light receiving surface (see FIG. 9B). Note that, in comparison with the light receiving surface side electrode 7a, the adhesion strength of the back surface side electrode 7b can be made larger by enlarging an adhesion area where the electrode 7b adheres onto the photovoltaic body 6. Accordingly, even when the solar cell 1a is warped to be convex toward the back surface side as shown in FIG. 9B, damage to the back surface side electrode 7b is small.

As described above, according to the photovoltaic module 10 of this embodiment, it is possible to provide a photovoltaic module that allows the reliability to be improved by suppressing the damage accumulated in the collector electrode provided on the light receiving surface side, and the method for manufacturing such a photovoltaic module.

Other Embodiments

Although the present invention has been described by using the foregoing embodiment, it should not be understood that the descriptions and the drawings constituting part of this disclosure limit the present invention. From this disclosure, it is obvious to one skilled in the art that various alternative embodiments, examples and applied techniques can be made.

For example, although the back surface side electrode 7b is made to adhere to the entire back surface of the photovoltaic body 6 in the foregoing embodiment, the back surface side electrode 7b may adhere to the photovoltaic body 6 so as to expose a part of the photovoltaic body 6, or the back surface side electrode 7b may be formed in a comb-like shape similar to that of the light receiving surface side electrode 7a.

As such, needless to say, the present invention includes various embodiments and the like that are not described in this disclosure. Accordingly, the technical scope of the present invention should be limited only by the scope of the invention as defined by the appended claims appropriate for the foregoing description.

EXAMPLES

Hereinafter, the photovoltaic module of the present invention will be described specifically by taking examples. The present invention is not limited to the below-described examples, and any appropriate modification can be made as long as the spirit and scope of the invention are not changed.
<Relationship Between Heating Condition and Degree of Cross-Linkage>

In the first place, a relationship between a temperature in the crosslinking process and the degree of cross-linkage was examined by using an EVA sheet as a sealing material sheet. Firstly, a glass plate, an EVA sheet with the thickness of 0.6 mm and a PET film were placed in this order on a mounting table of a lamination apparatus. Secondly, these materials are heated under reduced pressure at a temperature of approximately 120° C. for 10 minutes. In this way, the air was released, and the temporary adhesion was completed. Note that the temperature of approximately 120° C. is lower than the crosslinking temperature of the EVA. Thirdly, the sample in a temporary adhering state was placed in a heating furnace, and the crosslinking process was performed at a heating temperature of approximately 150° C. At this time, the crosslinking processes were performed with the heating duration changed within a range of 5 minutes to 45 minutes, since the degree of cross-linkage of the sealing material(EVA) also depends on the heating duration. Fourthly, only the sealing material was taken off from the glass plate of each of the samples thus manufactured, and then the gel fraction was measured in the following manner. Thereby, the degree of cross-linkage of each of sealing materials was evaluated.

Firstly, the weight of each sealing material taken off from the glass plate was measured. Secondly, each sealing material was immersed in a xylene solvent, and thereby a region in a sol state where crosslinks were not formed was dissolved into the solvent. Thirdly, the crosslinked gel region was extracted by evaporating the xylene solution. Fourthly, the weight of the extracted gel region was measured, and the gel fraction was figured out by calculating a ratio of the weight of the gel region, to the weight of the sealing material before the immersion into the solvent. The following shows the equation for this calculation.

Gel fraction (%)=(the weight of an undissolved region/the weight of a sample before the immersion)×100

Table 2 is a property table showing the thus figured-out gel fractions of the respective samples.

TABLE 2

| HEATING DURATION AT 150° C. | GEL FRACTION(%) |
| --- | --- |
| 0 | 0 |
| 5 | 13 |
| 10 | 27 |
| 15 | 35 |
| 20 | 53 |
| 30 | 71 |
| 45 | 87 |

As shown in Table 2, it was found that the gel fraction of an obtained sealing material can be changed within a range of 13% to 87% by adjusting the heating duration within a range of 5 minutes to 45 minutes when the cosslinking process is performed at the temperature of approximately 150° C.

Manufacturing Examples and Comparative Example

In the second place, photovoltaic modules according to the present invention were manufactured on the basis of the result shown in Table 2, in the following manner. In these examples, the same sealing material sheet was used as a sealing material of the light receiving side and a sealing material of the back surface side. For this reason, the photovoltaic modules of the present invention were each manufactured by performing the second curing process using the lower heating temperature for the sealing material sheet of the back surface side than that for the sealing material sheet of the light receiving side.

Note that an EVA sheet with the thickness of approximately 0.6 mm was used as each of the sealing material sheets of the light receiving side and the back surface side in the following examples. Moreover, as each of the solar cells, used was a solar cell with the thickness of 100 to 140 µm having a HIT (registered trademark) structure that includes a pn junction consisting of n-type single-crystal silicon and p-type amorphous silicon with a thin rtype amorphous silicon layer interposed in between. In addition, a glass plate with the thickness of approximately 3.2 mm was used as each of the light receiving surface side supporting members, and a lamination film consisting of a tedra film with the thickness of approximately 38 µm, an aluminum film with the thickness of approximately 30 µm, and a tedra film with the thickness of approximately 38 µm was used as each of the back surface side supporting members.

Example 1

A sample of an example 1 was fabricated by performing the laminating process for 10 minutes, the first curing process for 0 minute, and the second curing process for 45 minutes.

In other words, in the sample of the example 1, the sealing material on the light receiving surface side was heated at the temperature of 150° C. for 45 minutes, while the sealing material on the back surface side was heated at the temperature of 150° C. for 0 minute. Hence, from the foregoing result shown in Table 2, it can be assumed that the gel fraction of the sealing material on the light receiving surface side is approximately 87%, and that the gel fraction of the sealing material on the back surface side is approximately 0%.

Example 2

A sample of an example 2 was fabricated by performing the laminating process for 10 minutes, the first curing process for 5 minutes, and the second curing process for 40 minutes.

In other words, in the sample of the example 2, the sealing material on the light receiving surface side was heated at the temperature of 150° C. for 45 minutes, while the sealing material on the back surface side was heated at the temperature of 150° C. for 5 minutes. Hence, from the foregoing result shown in Table 2, it can be assumed that the gel fraction of the sealing material on the light receiving surface side is approximately 87%, and that the gel fraction of the sealing material on the back surface side is approximately 13%.

Example 3

A sample of an example 3 was fabricated by performing the laminating process for 10 minutes, the first curing process for 10 minutes, and the second curing process for 35 minutes.

In other words, in the sample of the example 3, the sealing material on the light receiving surface side was heated at the temperature of 150° C. for 45 minutes, while the sealing material on the back surface side was heated at the temperature of 150° C. for 10 minutes. Hence, from the foregoing result shown in Table 2, it can be assumed that the gel fraction of the sealing material on the light receiving surface side is approximately 87%, and that the gel fraction of the sealing material on the back surface side is approximately 27%.

Example 4

A sample of an example 4 was fabricated by performing the laminating process for 10 minutes, the first curing process for 20 minutes, and the second curing process for 25 minutes.

In other words, in the sample of the example 4, the sealing material on the light receiving surface side was heated at the temperature of 150° C. for 45 minutes, while the sealing material on the back surface side was heated at the temperature of 150° C. for 20 minutes. Hence, from the foregoing result shown in Table 2, it can be assumed that the gel fraction of the sealing material on the light receiving surface side is approximately 87%, and that the gel fraction of the sealing material on the back surface side is approximately 53%.

Example 5

A sample of an example 5 was fabricated by performing the laminating process for 10 minutes, the first curing process for 30 minutes, and the second curing process for 15 minutes.

In other words, in the sample of the example 5, the sealing material on the light receiving surface side was heated at the temperature of 150° C. for 45 minutes, while the sealing material on the back surface side was heated at the temperature of 150° C. for 15 minutes. Hence, from the foregoing result shown in Table 2, it can be assumed that the gel fraction of the sealing material on the light receiving surface side is approximately 87%, and that the gel fraction of the sealing material on the back surface side is approximately 71%.

Comparative Example 1

A sample of a comparative example 1 was fabricated by performing the laminating process for 10 minutes, the first curing process for 45 minutes, and the second curing process for 0 minute In other words, in the sample of the comparative example 1, the sealing material on both of the light receiving side and of the back surface side was heated at the temperature of 150° C. for 45 minutes. Hence, from the foregoing result shown in Table 2, it can be assumed that the gel fraction of the sealing material on both of the light receiving surface and of the back surface side is approximately 87%.

<Temperature Cycle Test>

Each of the photovoltaic modules of the examples 1 to 5 and the comparative example 1 was examined by performing the below-described temperature cycle test with a temperature-controlled bath, and the output power of the photovoltaic module before and after the cycle test were compared.

The cycle test was performed a method in conformity with the temperature cycle test of JIS C 8917. FIG. 10 is a graph showing a change of the temperature condition that was programmed in a controller of the temperature-controlled bath. As shown in FIG. 10, firstly the temperature was increased from 25° C. to 90° C. by taking 45 minutes, secondly the upper limit temperature was maintained for 90 minutes, thirdly the temperature was decreased up to −40° C. by taking 90 minutes, fourthly the lower limit temperature was maintained for 90 minutes, and fifthly the temperature was increased up to 25° C. by taking 45 minutes. One cycle (6 hours) consists of these five time periods.

In the temperature cycle test, in addition to the temperature cycle test method of JIS C 8917, the inventors of the present invention irradiated the photovoltaic module with light of AM1.5, 100 mW/cm² from the light receiving surface side for the first 180 minutes, in order to make the test environment closer to an environment under exposure to the solar rays. Incidentally, assuming that a half of the time period in one cycle is a daytime, and that the other half is a nighttime, the irradiating duration was set to 180 minutes, the period of which is half of one cycle.

With this light irradiation, the temperature of the test-target photovoltaic module on the light receiving surface side can be made higher than that on the back surface side. In other words, it can be assumed that this light irradiation caused the temperature of the sealing material on the light receiving surface side to be higher than 90° C., when the temperature inside the temperature-controlled bath was kept at 90° C.

Then, each of the cycle tests was performed by repeating this cycle up to 400 cycles. As the result of the cycle tests, the power properties of the respective samples were checked. Table 3 shows this result.

Note that Table 3 shows each measurement result by using a normalized power reduction ratio. Here, the power reduction ratio is calculated by using the following equation:

power reduction ratio (%)={(pretest power−posttest power)/pretest power}×100.

Accordingly, the smaller power reduction ratio means that the power reduction is smaller, and thereby that the photovoltaic module brings the superior reliability. Moreover, the normalized power reduction ratio is a normalized value by using the power reduction ratio of the comparative example as 1.00.

TABLE 3

| | GEL FRACTION ON FRONT SURFACE (%) | GEL FRACTION ON BACK SURFACE (%) | NORMALIZED POWER REDUCTION RATIO |
|---|---|---|---|
| COMPARATIVE 1 | 87 | 87 | 1.00 |
| EXAMPLE 1 | 87 | 0 | 0.50 |
| EXAMPLE 2 | 87 | 13 | 0.50 |
| EXAMPLE 3 | 87 | 27 | 0.53 |
| EXAMPLE 4 | 87 | 53 | 0.70 |
| EXAMPLE 5 | 87 | 71 | 0.73 |

By referring to Table 3, it is found that the normalized power reduction ratios of the examples 1 to 5 are lower than the normalized power reduction ratio of the comparative example. By taking the samples of the examples 1 to 5 into consideration, it may be concluded that this resulted from a phenomenon that the property deterioration after long-time use was suppressed by making the degree of cross-linkage of the sealing material on the back surface side smaller than that of the sealing material on the light receiving surface. Incidentally, the property deterioration was attributable to the difference in the way that the light receiving and back surfaces of each of the photovoltaic module are subjected to light.

Additionally, it can be seen that, in a case where the gel fraction on the back surface side is smaller than that on the light receiving side by 50% or more as in the cases of the examples 1 to 3, the power reduction ratio is decreased by approximately half as compared with that of the comparative example. As such, according to this embodiment, obtained were the photovoltaic modules whose power reduction ratios are low in comparison with the conventional ones, and each of which brings the superior reliability.

As described above, according to the present invention, it is possible to provide a photovoltaic module that brings superior reliability by suppressing the property deterioration after long-time use attributable to the difference in the way that the light receiving and back surfaces of the collector electrode are subjected to the solar light. Moreover, the present invention is particularly suitable for a photovoltaic module including solar cells each using a thin substrate that is more likely to be warped because of stresses.

Note that, it should be understood that the embodiment disclosed here is just an example in all respects, and is not a restrictive one. The embodiment of the present invention can be appropriately modified in various manners without departing from the technical sprit described in the scope of claims.

What is claimed is:
1. A photovoltaic module comprising:
 a solar cell having a light receiving surface allowing light to enter therein, and a back surface provided on the opposite side of the light receiving surface;
 a light receiving surface side supporting member provided at the light receiving surface side of the solar cell;
 a back surface side supporting member provided at the back surface side of the solar cell; and
 a sealing material for sealing the solar cell between the light receiving surface side supporting member and the back surface side supporting member; wherein the sealing material includes a first region that is in contact with the light receiving surface, and a second region that is in contact with the back surface, the sealing material of the first region and the second region being of the same sealing material to which a cross-linking agent of a same type and amount is added, and a degree of cross-linkage of the second region is smaller than a degree of cross-linkage of the first region.

2. The photovoltaic module according to claim 1, wherein a gel fraction of the second region is smaller than a gel fraction of the first region.

3. The photovoltaic module according to claim 1, wherein the solar cell further includes a photovoltaic body for generating photogenerated carriers by receiving light, and a collector electrode which adheres onto the light receiving surface and the back surface of the photovoltaic body, and which collects the photogenerated carriers from the photovoltaic body, and an adhesion area where the collector electrode adheres onto the light receiving surface of the photovoltaic body is smaller than an adhesion area where the collector electrode adheres onto the back surface of the photovoltaic body.

4. A photovoltaic module comprising;

a solar cell having a light receiving surface allowing light to enter therein, and a back surface provided on the opposite side of the light receiving surface;

a light receiving surface side supporting member provided at the light receiving surface side of the solar cell;

a back surface side supporting member provided at the back surface side of the solar cell; and a sealing material for sealing the solar cell between the light receiving surface side supporting member and the back surface side supporting member; wherein the sealing material includes a first region that is in contact with the light receiving surface, and a second region that is in contact with the back surface, the sealing material of the first region and the second region being of the same sealing material to which a cross-linking agent of a same type and amount is added, and a gel fraction of the second region is smaller than a gel fraction of the first region.

\* \* \* \* \*